(12) United States Patent
Shen et al.

(10) Patent No.: US 11,174,386 B2
(45) Date of Patent: Nov. 16, 2021

(54) RESIN COMPOSITION AND ARTICLE MADE THEREFROM

(71) Applicant: Elite Electronic Material (KunShan) Co., Ltd., Kunshan (CN)

(72) Inventors: Chenyu Shen, Kunshan (CN); Yan Zhang, Kunshan (CN); Jue Tan, Kunshan (CN); Rongtao Wang, Kunshan (CN); Chen-Yu Hsieh, Taoyuan (TW)

(73) Assignee: Elite Electronic Material (Kunshan) Co., Ltd., Kunshan (CN)

( * ) Notice: Subject to any disclaimer, the term of this patent is extended or adjusted under 35 U.S.C. 154(b) by 225 days.

(21) Appl. No.: 16/716,909

(22) Filed: Dec. 17, 2019

(65) Prior Publication Data

US 2021/0108076 A1 Apr. 15, 2021

(30) Foreign Application Priority Data

Oct. 11, 2019 (CN) .......................... 201910961697.1

(51) Int. Cl.
| | |
|---|---|
| *C08L 71/12* | (2006.01) |
| *C08L 57/00* | (2006.01) |
| *C08K 3/22* | (2006.01) |
| *C08K 3/36* | (2006.01) |
| *C08J 5/24* | (2006.01) |
| *C08L 47/00* | (2006.01) |

(52) U.S. Cl.
CPC .............. *C08L 71/126* (2013.01); *C08J 5/24* (2013.01); *C08K 3/22* (2013.01); *C08K 3/36* (2013.01); *C08L 47/00* (2013.01); *C08L 57/00* (2013.01); *C08K 2003/222* (2013.01); *C08K 2201/003* (2013.01); *C08L 2203/16* (2013.01); *C08L 2203/20* (2013.01); *C08L 2205/03* (2013.01)

(58) Field of Classification Search
CPC ........ C08L 47/00; C08L 71/12; C08L 71/126; C08L 9/00
See application file for complete search history.

(56) References Cited

U.S. PATENT DOCUMENTS

2021/0108075 A1* 4/2021 Chang ..................... C08L 77/00

* cited by examiner

*Primary Examiner* — Kregg T Brooks
(74) *Attorney, Agent, or Firm* — Muncy, Geissler, Olds & Lowe, P.C.

(57) ABSTRACT

A resin composition includes: (A) a vinyl-containing polyphenylene ether resin; (B) a resin of Formula (1); and (C) an inorganic filler. Moreover, also provided is an article made from the resin composition described above, which comprises a prepreg, a resin film, a laminate or a printed circuit board, wherein the article achieves improvement in at least one of the following properties: dissipation factor, comparative tracking index, X-axis thermal expansion coefficient, and temperature coefficient of dielectric constant.

Formula (1)

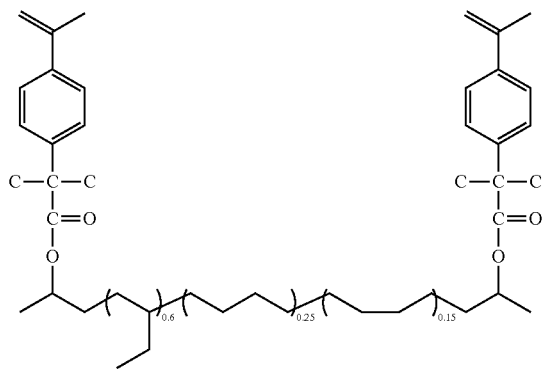

13 Claims, No Drawings

RESIN COMPOSITION AND ARTICLE MADE THEREFROM

CROSS-REFERENCE TO RELATED APPLICATION

This application claims the priority benefits of China Patent Application No. 201910961697.1, filed on Oct. 11, 2019, the entirety of which is hereby incorporated by reference herein and made a part of this specification.

BACKGROUND

1. Field of the Disclosure

The present disclosure relates to a resin composition with ultra-low dielectric properties and more particularly to a resin composition comprising a vinyl-containing polyphenylene ether resin and an article made therefrom, such as a prepreg, a resin film, a laminate or a printed circuit board.

2. Description of Related Art

Recently, due to the trend of miniaturization and multi-functionality in 5G of electronic products, circuit boards were developed toward multi-layer configuration, high trace interconnection density, and high speed signal transmission, thereby presenting more challenges to the overall performance of circuit laminates such as copper-clad laminates. Conventionally, polyphenylene ether resins (a.k.a. polyphenylene oxide resins) are widely used for making low dielectric copper-clad laminates, but a polyphenylene ether resin being used to make copper-clad laminates has poor compatibility with other resins, which causes the problems of high thermal expansion coefficient and poor dielectric properties, thereby failing to meet the demands of new generation high frequency and low dielectric printed circuit boards. Accordingly, there is a need to develop a material for copper-clad laminates that has better overall performance.

SUMMARY

To address the drawbacks described above, it is a primary object of the present disclosure to provide a resin composition and an article made therefrom which may overcome at least one of the above-mentioned technical problems.

To achieve the above-mentioned objects, the present disclosure provides a resin composition, comprising: (A) a vinyl-containing polyphenylene ether resin; (B) a resin of Formula (1):

Formula (1)

and
(C) an inorganic filler.

In one embodiment, the resin composition comprises 70 parts by weight of (A) the vinyl-containing polyphenylene ether resin and 10 to 20 parts by weight of (B) the resin of Formula (1).

In one embodiment, (C) the inorganic filler comprises magnesium oxide-silica, silica or a combination thereof.

In one embodiment, the magnesium oxide-silica has a particle size distribution ($D_{50}$) of 2 $\mu m \leq D_{50} \leq 5$ $\mu m$.

In one embodiment, the resin composition comprises 20 to 50 parts by weight of the magnesium oxide-silica, 5 to 50 parts by weight of the silica or a combination thereof; the term "combination" as used herein refers to the combination of 20 to 50 parts by weight of the magnesium oxide-silica and 5 to 50 parts by weight of the silica.

In one embodiment, the resin composition comprises 20 to 45 parts by weight of the magnesium oxide-silica, 5 to 35 parts by weight of the silica or a combination thereof.

In one embodiment, the resin composition may further comprise maleimide resin, (meth)acrylate, triallyl isocyanurate, triallyl cyanurate, styrene maleic anhydride, 1,2-bis(vinylphenyl)ethane, bis(vinylbenzyl)ether, 1,2,4-trivinyl cyclohexane, divinylbenzene, styrene, polyolefin, epoxy resin, cyanate ester resin, maleimide triazine resin, phenolic resin, benzoxazine resin, polyester resin, amine curing agent, polyamide resin, polyimide resin or a combination thereof.

In addition, in one embodiment, the resin composition may further comprise flame retardant, curing accelerator, polymerization inhibitor, surface treating agent, coloring agent, toughening agent, solvent or a combination thereof.

Another main object of the present disclosure is to provide an article made from the aforesaid resin composition, comprising a prepreg, a resin film, a laminate or a printed circuit board.

In one embodiment, articles made from the resin composition disclosed herein have one, more or all of the following properties:
a dissipation factor as measured by reference to JIS C2565 at 10 GHz of less than or equal to 0.00171 after being subject to moisture absorption for 168 hours at a temperature of 85° C. and a relative humidity of 85%;
an increase rate of dissipation factor after moisture absorption of less than or equal to 3%;
a comparative tracking index as measured by reference to ASTM D3638 of greater than or equal to 210V;
an X-axis thermal expansion coefficient as measured by reference to IPC-TM-650 2.4.24.5 of less than or equal to 17.0 ppm/° C.; and
a temperature coefficient of dielectric constant as measured by reference to IPC-TM-650 2.5.5.13 of less than or equal to 100 ppm/° C.

DESCRIPTION OF THE EMBODIMENTS

To enable those skilled in the art to further appreciate the features and effects of the present disclosure, words and terms contained in the specification and appended claims are described and defined. Unless otherwise defined, all technical and scientific terms used herein have the same meaning as commonly understood by those of ordinary skill in the art to which this disclosure pertains. In the case of conflict, the present document and definitions contained herein will control.

While some theories or mechanisms may be proposed herein, the present disclosure is not bound by any theories or mechanisms described regardless of whether they are right or wrong, as long as the embodiments can be implemented according to the present disclosure.

As used herein, "a," "an" or any similar expression is employed to describe components and technical features of the present disclosure. This is done merely for expressing conveniently and to give a general sense of the scope of the present disclosure. Accordingly, this description should be read to include one or at least one and the singular also includes the plural at the same time unless it is obvious to mean otherwise.

As used herein, the term "encompass," "comprises," "comprising," "includes," "including," "has," "having" or any other variant thereof is construed as an open-ended transitional phrase intended to cover a non-exclusive inclusion. For example, a composition or article that comprises a list of elements is not necessarily limited to only those elements but may include other elements not expressly listed or inherent to such composition or article. Further, unless expressly stated to the contrary, the term "or" refers to an inclusive or and not to an exclusive or. For example, a condition "A or B" is satisfied by any one of the following: A is true (or present) and B is false (or not present), A is false (or not present) and B is true (or present), and both A and B are true (or present). In addition, whenever open-ended transitional phrases are used, such as "comprises," "comprising," "includes," "including," "has," "having" or any other variant thereof, it is understood that close-ended transitional phrases such as "consisting of," "composed by" and "remainder being" and partially open transitional phrases such as "consisting essentially of," "primarily consisting of," "mainly consisting of," "primarily containing," "composed essentially of," "composed of," "essentially having," etc. are also disclosed and included.

In this disclosure, features and conditions such as values, numbers, contents, amounts or concentrations presented as a numerical range or a percentage range are merely for convenience and brevity. Therefore, a numerical range or a percentage range should be interpreted as encompassing and specifically disclosing all possible subranges and individual numerals or values therein, including integers and fractions, particularly all integers therein. For example, a range of "1.0 to 8.0" should be understood as explicitly disclosing all subranges such as 1.0 to 7.0, 2.0 to 8.0, 2.0 to 6.0, 3.0 to 6.0, 4.0 to 8.0, 3.0 to 8.0 and so on and encompassing the end points of the ranges, particularly subranges defined by integers, as well as disclosing all individual values such as 1.0, 2.0, 3.0, 4.0, 5.0, 6.0, 7.0 and 8.0. Similarly, a range of "from 1.0 to 8.0" or "between 1.0 and 8.0" should be understood as explicitly disclosing all ranges such as 1.0 to 8.0, 1.0 to 7.0, 2.0 to 8.0, 2.0 to 6.0, 3.0 to 6.0, 4.0 to 8.0, 3.0 to 8.0 and so on and encompassing the end points of the ranges. Unless otherwise defined, the aforesaid interpretation rule should be applied throughout the present disclosure regardless of broadness of the scope.

Whenever amount, concentration or other numeral or parameter is expressed as a range, a preferred range or a series of upper and lower limits, it is understood that all ranges defined by any pair of the upper limit or preferred value and the lower limit or preferred value are specifically disclosed, regardless whether these ranges are explicitly described or not. In addition, unless otherwise defined, whenever a range is mentioned, the range should be interpreted as inclusive of the endpoints and every integers and fractions in the range.

Given the intended purposes and advantages of this disclosure are achieved, numerals or figures have the precision of their significant digits. For example, 40.0 should be understood as covering a range of 39.50 to 40.49.

As used herein, a Markush group or a list of items is used to describe examples or embodiments of the present disclosure. A skilled artisan will appreciate that all subgroups of members or items and individual members or items of the Markush group or list can also be used to describe the present disclosure. For example, when X is described as being "selected from a group consisting of X1, X2 and X3," it is intended to disclose the situations of X is X1 and X is X1 and/or X2 and/or X3. In addition, when a Markush group or a list of items is used to describe examples or embodiments of the present disclosure, a skilled artisan will understand that any subgroup or any combination of the members or items in the Markush group or list may also be used to describe the present disclosure. Therefore, for example, when X is described as being "selected from a group consisting of X1, X2 and X3" and Y is described as being "selected from a group consisting of Y1, Y2 and Y3," the disclosure includes any combination of X is X1 and/or X2 and/or X3 and Y is Y1 and/or Y2 and/or Y3.

As used herein, "or a combination thereof" means "or any combination thereof".

Unless otherwise specified, the term "resin" of the present disclosure is construed as comprising monomer, polymer or a combination thereof, but not limited thereto. A polymer refers to a chemical substance formed by one, two or more monomers via polymerization and may comprise a homopolymer, a copolymer, a prepolymer, etc., but not limited thereto. In addition, the term "polymer" includes but is not limited to an oligomer. An oligomer refers to a polymer with 2-20, typically 2-5, repeating units. For example, in the present disclosure, the term "maleimide resin" is construed to encompass a maleimide monomer, a maleimide polymer, a combination of maleimide monomers, a combination of maleimide polymers, and a combination of maleimide monomer(s) and maleimide polymer(s).

Unless otherwise specified, according to the present disclosure, a compound refers to a chemical substance formed by two or more elements bonded with chemical bonds.

Unless otherwise specified, according to the present disclosure, a resin encompasses the resin and its modification. The aforesaid modification comprises a product derived from a resin with its reactive functional group modified, a product derived from a prepolymerization reaction of a resin and other resins, a product derived from a crosslinking reaction of a resin and other resins, a product derived from homopolymerizing a resin, a product derived from copolymerizing a resin and other resins, etc.

Unless otherwise specified, according to the present disclosure, a DOPO derivative refers to a product of a DOPO structure with its hydrogen atom on —P—H substituted by halogen, hydroxyl group, oxygen, etc. For example, a DPPO derivative refers to a product of a DPPO structure with its hydrogen atom on —P—H substituted by halogen, hydroxyl group, oxygen, etc.

It should be understood that all features disclosed herein may be combined in any way to constitute the technical solution of the present disclosure, as long as there is no conflict present in the combination of these features.

Examples and embodiments are described in detail below. It will be understood that these examples and embodiments are exemplary only and are not intended to limit the scope and use of the present disclosure. Unless otherwise specified, processes, reagents and conditions described in the examples are those known in the art.

As described above, the present disclosure primarily aims to provide a resin composition, comprising: (A) a vinyl-containing polyphenylene ether resin; (B) a resin of Formula (1):

Formula (1)

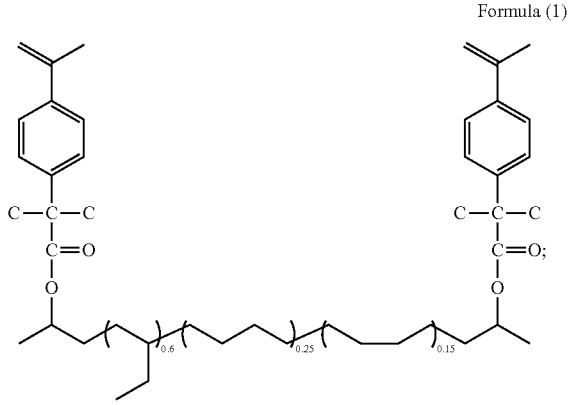

and (C) an inorganic filler.

As used herein, "vinyl-containing" refers to the presence of an ethylenic carbon-carbon double bond (C=C) or a functional group derived therefrom in a compound. Therefore, examples of "vinyl-containing" may include, but not limited to, a structure containing a vinyl group, an allyl group, a vinylbenzyl group, a methacrylate group or the like. Unless otherwise specified, the position of the aforesaid functional group is not particularly limited and may be located at the terminal of a long-chain structure. In other words, the vinyl-containing polyphenylene ether resin described herein represents a polyphenylene ether resin containing a vinyl group, examples including but not limited to a polyphenylene ether resin containing a vinyl group, an allyl group, a vinylbenzyl group, a methacrylate group or the like.

For example, in one embodiment, the vinyl-containing polyphenylene ether resin comprises a vinylbenzyl-containing polyphenylene ether resin, a methacrylate-containing polyphenylene ether resin (i.e., methacryloyl-containing polyphenylene ether resin), an allyl-containing polyphenylene ether resin, a vinylbenzyl-modified bisphenol A polyphenylene ether resin, a chain-extended vinyl-containing polyphenylene ether resin or a combination thereof.

For example, the vinyl-containing polyphenylene ether resin may be a vinylbenzyl-containing polyphenylene ether resin with a number average molecular weight of about 1200 (such as OPE-2st 1200, available from Mitsubishi Gas Chemical Co., Inc.), a vinylbenzyl-containing polyphenylene ether resin with a number average molecular weight of about 2200 (such as OPE-2st 2200, available from Mitsubishi Gas Chemical Co., Inc.), a methacrylate-containing polyphenylene ether resin with a number average molecular weight of about 1900 to 2300 (such as SA-9000, available from Sabic), a vinylbenzyl-modified bisphenol A polyphenylene ether resin with a number average molecular weight of about 2400 to 2800, a chain-extended vinyl-containing polyphenylene ether resin with a number average molecular weight of about 2200 to 3000, or a combination thereof. The chain-extended vinyl-containing polyphenylene ether resin may include various polyphenylene ether resins disclosed in the US Patent Application Publication No. 2016/0185904 A1, all of which are incorporated herein by reference in their entirety.

In addition, for example, the vinyl-containing polyphenylene ether resin may comprise a structure of Formula (D):

$$Z_1 \text{—} (Y_1 \text{—} Q_1)_{b1} Y_2 \text{—} Z_2 \quad \text{Formula (D)}$$

wherein b1 is a natural number of 0 to 10 and preferably a natural number of 0 to 5; $Q_1$ comprises a structure of any one of Formula (D-1) to Formula (D-3):

Formula (D-1)

Formula (D-2)

Formula (D-3)

$Y_1$ and $Y_2$ independently comprise a structure of Formula (D-4):

Formula (D-4)

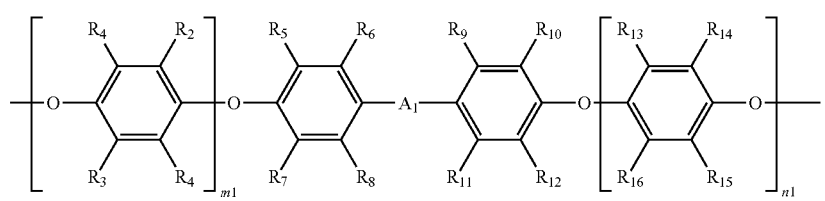

In Formula (D-4), m1 and n1 independently represent an integer of 1 to 15, such as 1, 5, 10 or 15; $R_1$ to $R_{16}$ are independently selected from H, —$CH_3$ and a halogen atom (e.g., chlorine, bromine, or iodine); $A_1$ is selected from a covalent bond, —$CH_2$—, —$CH(CH_3)$—, —$C(CH_3)_2$—, —O—, —S—, —$SO_2$— and a carbonyl group;

$Z_1$ and $Z_2$ independently comprise a structure of Formula (D-5), Formula (D-6) or Formula (D-7):

Formula (D-5)

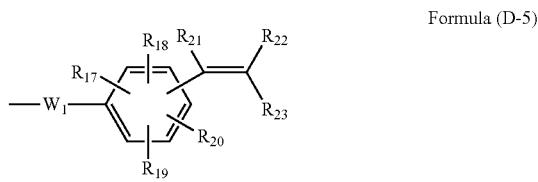

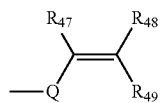

Formula (D-6)

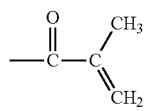

Formula (D-7)

In Formula (D-5), $R_{17}$ to $R_{23}$ are individually selected from H, —$CH_3$ and a halogen atom, and $W_1$ is a $C_1$-$C_3$ bivalent aliphatic group, such as methylene, ethylene, or propylene. In Formula (D-6), $R_{47}$ to $R_{49}$ are individually selected from H, —$CH_3$ and a halogen atom, and Q is a $C_1$-$C_3$ bivalent aliphatic group, such as methylene, ethylene, or propylene.

For example, the vinyl-containing polyphenylene ether resin may comprise a structure below:

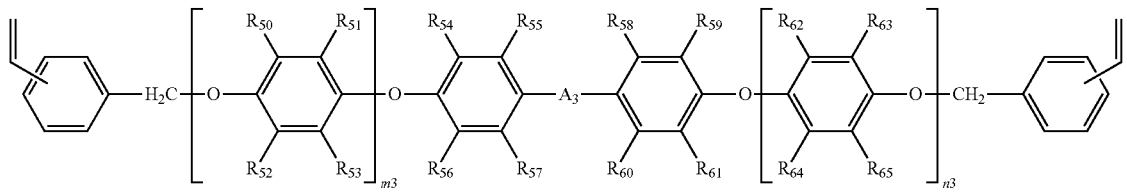

wherein m3 and n3 independently represent an integer of 1 to 15; $R_{50}$ to $R_{65}$ are independently selected from H, —$CH_3$ and a halogen atom; and $A_3$ is selected from a covalent bond, —$CH_2$—, —$CH(CH_3)$—, —$C(CH_3)_2$—, —O—, —S—, —$SO_2$— and a carbonyl group.

In one embodiment, the inorganic filler is magnesium oxide-silica, silica or a combination thereof.

As used herein, "magnesium oxide-silica" refers to a substance containing $2MgO(SiO_2)$ and may encompass the inclusion of $2MgO(SiO_2)$ as the main component for performing the function or property of magnesium oxide-silica. That is, "magnesium oxide-silica" may include a substance containing components other than $2MgO(SiO_2)$ according to the purpose of microparticles as described herein as long as the intended purpose and scope of the present disclosure remain unchanged. In addition, the magnesium oxide-silica may be optionally pretreated by a surface treating agent.

According to the present disclosure, the magnesium oxide-silica has a particle size distribution ($D_{50}$) of 2 $\mu m \leq D_{50} \leq 5$ $\mu m$ to provide excellent dispersivity of the magnesium oxide-silica.

According to the present disclosure, examples of the silica include but are not limited to fused, non-fused, spherical, porous or hollow type silica; in addition, the silica may be optionally pretreated by a surface treating agent.

For example, the surface treating agent comprises silane coupling agent, organosilicon oligomer, titanate coupling agent or a combination thereof. The addition of the surface treating agent may promote the dispersivity of the inorganic filler and the compatibility with resin components.

The amount of each component used in the resin composition disclosed herein is not particularly limited. For example, the resin composition may comprise 70 parts by weight of (A) the vinyl-containing polyphenylene ether resin and 10 to 20 parts by weight of (B) the resin of Formula (1).

In one embodiment, the resin composition disclosed herein may further comprise 20 to 50 parts by weight of the magnesium oxide-silica, 5 to 50 parts by weight of the silica or a combination thereof. Preferably, the resin composition disclosed herein comprises 20 to 45 parts by weight of the magnesium oxide-silica, 5 to 35 parts by weight of the silica or a combination thereof.

In one embodiment, the resin composition may optionally further comprise maleimide resin, (meth)acrylate, triallyl isocyanurate, triallyl cyanurate, styrene maleic anhydride, 1,2-bis(vinylphenyl)ethane, bis(vinylbenzyl)ether, 1,2,4-trivinyl cyclohexane, divinylbenzene, styrene, polyolefin, epoxy resin, cyanate ester resin, maleimide triazine resin, phenolic resin, benzoxazine resin, polyester resin, amine curing agent, polyamide resin, polyimide resin or a combination thereof.

For example, the maleimide resin refers to a compound, monomer, mixture, or polymer (including oligomer) containing at least one maleimide group. Unless otherwise specified, the maleimide resin used in the present disclosure is not particularly limited and may include any one or more maleimide resins useful for preparing a prepreg, a resin film, a laminate or a printed circuit board. Examples include but are not limited to 4,4'-diphenylmethane bismaleimide, oligomer of phenylmethane maleimide (a.k.a. polyphenylmethane maleimide), m-phenylene bismaleimide, bisphenol A diphenyl ether bismaleimide, 3,3'-dimethyl-5,5'-diethyl-4,4'-diphenyl methane bismaleimide, 4-methyl-1,3-phenylene bismaleimide, 1,6-bismaleimide-(2,2,4-trimethyl) hexane, N-2,3-xylylmaleimide, N-2,6-xylylmaleimide, N-phenyl maleimide, maleimide resin containing aliphatic long-chain structure or a combination thereof. In addition, unless otherwise specified, the aforesaid maleimide resin of the present disclosure may also comprise a prepolymer thereof, such as a prepolymer of diallyl compound and maleimide resin, a prepolymer of diamine and maleimide resin, a prepolymer of multi-functional amine and maleimide resin or a prepolymer of acid phenol compound and maleimide resin, but not limited thereto.

For example, the maleimide resin used herein may include products such as BMI-1000, BMI-1000H, BMI-1100, BMI-1100H, BMI-2000, BMI-2300, BMI-3000, BMI-3000H, BMI-4000H, BMI-5000, BMI-5100, BM-7000 and BMI-7000H available from Daiwakasei Industry Co., Ltd., or products such as BMI-70 and BMI-80 available from K.I Chemical Industry Co., Ltd.

For example, the maleimide resin containing an aliphatic long-chain structure may include products such as BMI-689, BMI-1400, BMI-1500, BMI-1700, BMI-2500, BMI-3000, BMI-5000 and BMI-6000 sold by Designer Molecules Inc.

For example, unless otherwise specified, the maleimide triazine resin used in the present disclosure is not particularly limited and may include any one or more maleimide triazine resins useful for preparing a prepreg, a resin film, a laminate or a printed circuit board. For example, the maleimide triazine resin may be obtained by polymerizing the aforesaid cyanate ester resin and the aforesaid maleimide resin. The maleimide triazine resin may be obtained by polymerizing bisphenol A cyanate ester and maleimide resin, by polymerizing bisphenol F cyanate ester and maleimide resin, by polymerizing phenol novolac cyanate ester and maleimide resin or by polymerizing dicyclopentadiene-containing cyanate ester and maleimide resin, but not limited thereto.

For example, the maleimide triazine resin may be obtained by polymerizing the cyanate ester resin and the maleimide resin at any molar ratio. For example, relative to 1 mole of the maleimide resin, 1 to 10 moles of the cyanate ester may be used. For example, relative to 1 mole of the maleimide resin, 1, 2, 4, or 6 moles of the cyanate ester may be used, but not limited thereto.

For example, the (meth)acrylate may be a mono-functional (meth)acrylate, a bifunctional (meth)acrylate, or a multifunctional (meth)acrylate. In terms of improving the adhesiveness of the resin composition, the (meth)acrylate may comprise, but not limited to, tricyclodecane di(meth)acrylate, tri(meth)acrylate, 1,1'-[(octahydro-4,7-methano-1H-indene-5,6-diyl)bis(methylene)]ester (such as SR833S, available from Sartomer), isobornyl methacrylate, ethoxylated bisphenol A dimethacrylate (such as SR349, available from Sartomer), methyl methacrylate, cyclohexyl methacrylate, dicyclopentenyl methacrylate, dicyclopentanyl methacrylate, 1-adamantanyl methacrylate, dicyclopentyloxyethyl methacrylate, bisphenol A di(meth)acrylate, bisphenol A diglycidyl ether dimethacrylate, cyclohexyl 2-methylacrylate, phenyl methacrylate, 2-hydroxyethyl methacrylate, 4-hydroxybenzyl methacrylate, [[4-hydroxymethyl] cyclohexyl] methacrylate, 3-hydroxy-1-adamantanyl methacrylate, 2-oxotetrahydrofuran-3-yl methacrylate, 4-hydroxycyclohexyl methacrylate or a combination thereof.

For example, the styrene maleic anhydride may be any styrene maleic anhydrides known in the field to which this disclosure pertains, wherein the ratio of styrene (S) to maleic anhydride (MA) may be for example 1/1, 2/1, 3/1, 4/1, 6/1, 8/1 or 12/1, examples including styrene maleic anhydride copolymers such as SMA-1000, SMA-2000, SMA-3000, EF-30, EF-40, EF-60 and EF-80 available from Cray Valley, or styrene maleic anhydride copolymers such as C400, C500, C700 and C900 available from Polyscope, but not limited thereto.

For example, the epoxy resin may be any epoxy resins known in the field to which this disclosure pertains; in terms of improving the thermal resistance of the resin composition, the epoxy resin may include, but not limited to, bisphenol A epoxy resin, bisphenol F epoxy resin, bisphenol S epoxy resin, bisphenol AD epoxy resin, novolac epoxy resin, trifunctional epoxy resin, tetrafunctional epoxy resin, multifunctional novolac epoxy resin, dicyclopentadiene (DCPD) epoxy resin, phosphorus-containing epoxy resin, p-xylene epoxy resin, naphthalene epoxy resin (e.g., naphthol epoxy resin), benzofuran epoxy resin, or isocyanate-modified epoxy resin. The novolac epoxy resin may be phenol novolac epoxy resin, bisphenol A novolac epoxy resin, bisphenol F novolac epoxy resin, biphenyl novolac epoxy resin, phenol benzaldehyde epoxy resin, phenol aralkyl novolac epoxy resin or o-cresol novolac epoxy resin, wherein the phosphorus-containing epoxy resin may be DOPO (9,10-dihydro-9-oxa-10-phosphaphenanthrene-10-oxide) epoxy resin, DOPO-HQ epoxy resin or a combination thereof. The DOPO epoxy resin may be selected from DOPO-containing phenolic novolac epoxy resin, DOPO-containing cresol novolac epoxy resin, DOPO-containing bisphenol-A novolac epoxy resin, and a combination thereof; the DOPO-HQ epoxy resin may be selected from DOPO-HQ-containing phenolic novolac epoxy resin, DOPO-HQ-containing cresol novolac epoxy resin, DOPO-HQ-containing bisphenol-A novolac epoxy resin, and a combination thereof.

For example, the cyanate ester resin may include any one or more cyanate ester resins useful for preparing a prepreg, a resin film, a laminate or a printed circuit board, such as a compound having an Ar—O—C≡N structure, wherein Ar may be a substituted or unsubstituted aromatic group. In terms of improving the thermal resistance of the resin composition, examples of the cyanate ester resin include but are not limited to novolac cyanate ester resin, bisphenol A cyanate ester resin, bisphenol F cyanate ester resin, dicyclopentadiene-containing cyanate ester resin, naphthalene-containing cyanate ester resin, phenolphthalein cyanate ester resin, adamantane cyanate ester resin, fluorene cyanate ester resin or a combination thereof. The novolac cyanate ester resin may be bisphenol A novolac cyanate ester resin, bisphenol F novolac cyanate ester resin or a combination thereof. For example, the cyanate ester resin may be available under the tradename Primaset PT-15, PT-30S, PT-60S, BA-200, BA-230S, BA-3000S, BTP-2500, BTP-6020S, DT-4000, DT-7000, ULL950S, HTL-300, CE-320, LVT-50, or LeCy sold by Lonza.

For example, the phenolic resin may be any phenolic resins known in the field to which this disclosure pertains, including but not limited to phenoxy resin or novolac resin (such as phenol novolac resin, naphthol novolac resin, biphenyl novolac resin, dicyclopentadiene phenol resin or a combination thereof), but not limited thereto.

For example, the benzoxazine resin may be any benzoxazine resins known in the field to which this disclosure pertains. Examples include but are not limited to bisphenol A benzoxazine resin, bisphenol F benzoxazine resin, phenolphthalein benzoxazine resin, dicyclopentadiene benzoxazine resin, phosphorus-containing benzoxazine resin, dianiline benzoxazine resin and phenyl-modified, vinyl-modified or allyl-modified benzoxazine resin. Commercially available products include LZ-8270 (phenolphthalein benzoxazine resin), LZ-8298 (phenolphthalein benzoxazine resin), LZ-8280 (bisphenol F benzoxazine resin) and LZ-8290 (bisphenol A benzoxazine resin) available from Huntsman, and KZH-5031 (vinyl-modified benzoxazine resin) and KZH-5032 (phenyl-modified benzoxazine resin) available from Kolon Industries Inc. The dianiline benzoxazine resin may be diaminodiphenylmethane benzoxazine resin, diaminodiphenyl ether benzoxazine resin, diaminodiphenyl sulfone benzoxazine resin, diaminodiphenyl sulfide benzoxazine resin or a combination thereof, but not limited thereto.

For example, the polyester may be any polyesters known in the field to which this disclosure pertains. Examples of the polyester include but are not limited to a dicyclopentadiene-containing polyester and a naphthalene-containing polyester. Examples include, but not limited to, HPC-8000 or HPC-8150 available from D.I.C. Corporation.

For example, the amine curing agent may be any amine curing agents known in the field to which this disclosure pertains. Examples include but are not limited to diamino diphenyl sulfone, diamino diphenyl methane, diamino diphenyl ether, diamino diphenyl sulfide, dicyandiamide or a combination thereof.

For example, the polyolefin includes but is not limited to hydroxyl-terminated hydrogenated polybutadiene, butadiene-styrene copolymer, polybutadiene, hydrogenated styrene-butadiene copolymer, styrene-ethylene-propylene copolymer, styrene-butadiene-divinylbenzene terpolymer, styrene-butadiene-maleic anhydride terpolymer, vinyl-polybutadiene-urethane oligomer, styrene-isoprene copolymer, hydrogenated styrene-isoprene copolymer, hydrogenated styrene-butadiene-divinylbenzene terpolymer, maleic anhydride-butadiene copolymer, methyl styrene copolymer or a combination thereof.

In addition to the aforesaid components, the resin composition disclosed herein may optionally further comprise flame retardant, curing accelerator, polymerization inhibitor, surface treating agent, coloring agent, toughening agent, solvent or a combination thereof.

For example, the flame retardant may be any flame retardants known in the field to which this disclosure pertains, examples including but not limited to a phosphorus-containing flame retardant, comprising ammonium polyphosphate, hydroquinone bis-(diphenyl phosphate), bisphenol A bis-(diphenylphosphate), tri(2-carboxyethyl) phosphine (TCEP), phosphoric acid tris(chloroisopropyl) ester, trimethyl phosphate (TMP), dimethyl methyl phosphonate (DMMP), resorcinol bis(dixylenyl phosphate) (RDXP, such as commercially available PX-200, PX-201, and PX-202), phosphazene (such as commercially available SPB-100, SPH-100, and SPV-100), melamine polyphosphate, DOPO and its derivatives or resins, DPPO (diphenylphosphine oxide) and its derivatives or resins, melamine cyanurate, tri-hydroxy ethyl isocyanurate and aluminium phosphinate (e.g., commercially available OP-930 and OP-935).

For example, the flame retardant may be a DPPO compound (e.g., di-DPPO compound), a DOPO compound (e.g., di-DOPO compound), a DOPO resin (e.g., DOPO-HQ, DOPO-NQ, DOPO-PN, and DOPO-BPN), and a DOPO-containing epoxy resin, wherein DOPO-PN is a DOPO-containing phenol novolac resin, and DOPO-BPN may be a DOPO-containing bisphenol novolac resin, such as DOPO-BPAN (DOPO-bisphenol A novolac), DOPO-BPFN (DOPO-bisphenol F novolac) and DOPO-BPSN (DOPO-bisphenol S novolac).

The amount of the flame retardant used herein is not particularly limited and may be, relative to 70 parts by weight of the vinyl-containing polyphenylene ether resin, such as 1 part by weight to 100 parts by weight, 10 parts by weight to 90 parts by weight, 20 parts by weight to 80 parts by weight, 30 parts by weight to 70 parts by weight, or 40 parts by weight to 60 parts by weight.

For example, the curing accelerator (including curing initiator) may comprise a catalyst, such as a Lewis base or a Lewis acid. The Lewis base may comprise imidazole, boron trifluoride-amine complex, ethyltriphenyl phosphonium chloride, 2-methylimidazole (2MI), 2-phenyl-1H-imidazole (2PZ), 2-ethyl-4-methylimidazole (2E4MI), triphenylphosphine (TPP) and 4-dimethylaminopyridine (DMAP) or a combination thereof. The Lewis acid may comprise metal salt compounds, such as those of manganese, iron, cobalt, nickel, copper and zinc, such as zinc octanoate or cobalt octanoate. The curing accelerator also includes a curing initiator, such as a peroxide capable of producing free radicals, examples of curing initiator including but not limited to dicumyl peroxide, tert-butyl peroxybenzoate, dibenzoyl peroxide (BPO), 2,5-dimethyl-2,5-di(tert-butylperoxy)-3-hexyne (25B), bis(tert-butylperoxyisopropyl) benzene or a combination thereof.

For example, the polymerization inhibitor may comprise, but not limited to, 1,1-diphenyl-2-picrylhydrazyl radical, methyl acrylonitrile, 2,2,6,6-tetramethyl-1-oxo-piperidine, dithioester, nitroxide-mediated radical, triphenylmethyl radical, metal ion radical, sulfur radical, hydroquinone, 4-methoxyphenol, p-benzoquinone, phenothiazine, J-phenylnaphthylamine, 4-t-butylcatechol, methylene blue, 4,4'-butylidene bis(6-t-butyl-3-methylphenol), 2,2'-methylenebis (4-ethyl-6-t-butylphenol) or a combination thereof.

The polymerization inhibitor suitable for the resin composition of the present disclosure may include products derived from the polymerization inhibitor with its hydrogen atom or group substituted by other atom or group. Examples include products derived from a polymerization inhibitor with its hydrogen atom substituted by an amino group, a hydroxyl group, a carbonyl group or the like.

For example, the silane coupling agent may comprise silane (such as but not limited to siloxane) and may be further categorized according to the functional groups into amino silane, epoxide silane, vinyl silane, acrylate silane, methacrylate silane, hydroxyl silane, isocyanate silane, methacryloxy silane and acryloxy silane.

For example, the coloring agent may comprise but is not limited to dye or pigment.

The purpose of toughening agent used herein is to improve the toughness of the resin composition. For example, the toughening agent may comprise, but not limited to, carboxyl-terminated butadiene acrylonitrile rubber (CTBN rubber), core-shell rubber, or a combination thereof.

For example, the solvent may comprise, but not limited to, methanol, ethanol, ethylene glycol monomethyl ether, acetone, butanone (methyl ethyl ketone, MEK), methyl isobutyl ketone, cyclohexanone, toluene, xylene, methoxyethyl acetate, ethoxyethyl acetate, propoxyethyl acetate, ethyl acetate, dimethylformamide, dimethylacetamide, propylene glycol methyl ether, or a mixture thereof.

Another object of the present disclosure is to provide an article made from the aforesaid resin composition, such as a prepreg, a resin film, a laminate or a printed circuit board, but not limited thereto.

The article made from the resin composition may be a prepreg, which comprises a reinforcement material and a layered structure disposed thereon. The layered structure is formed by heating the resin composition at a high temperature to a semi-cured state (B-stage). Suitable baking temperature for making the prepreg may be 80° C. to 170° C. The reinforcement material may be any one of a fiber material, woven fabric, and non-woven fabric, and the woven fabric preferably comprises fiberglass fabrics. Types of fiberglass fabrics are not particularly limited and may be any commercial fiberglass fabric useful for various printed circuit boards, such as E-glass fiber fabric, D-glass fiber fabric, S-glass fiber fabric, T-glass fiber fabric, L-glass fiber fabric or Q-glass fiber fabric, wherein the fiber may comprise yarns and rovings, in spread form or standard form. Non-woven fabric preferably comprises liquid crystal polymer non-woven fabric, such as polyester non-woven fabric, polyurethane non-woven fabric and so on, but not limited thereto. Woven fabric may also comprise liquid crystal polymer woven fabric, such as polyester woven fabric, polyurethane woven fabric and so on, but not limited thereto. The reinforcement material may increase the mechanical strength of the prepreg. In terms of the impregnation property of the resin composition, the thermal resistance, the moisture absorption resistance and the processability of the laminate made therefrom, in one preferred embodiment, the reinforcement material can be optionally pre-treated by a surface treating agent. The prepreg may be further heated and cured to the C-stage to form an insulation layer.

The article made from the resin composition may be a resin film prepared by heating and baking to semi-cure the resin composition. The resin composition may be selectively coated on a polyethylene terephthalate film (PET film), a polyimide film (PI film), a copper foil or a resin-coated copper (RCC), followed by heating and baking to semi-cure the resin composition to form the resin film.

The article made from the resin composition may be a laminate, which comprises two metal foils and an insulation layer disposed between the metal foils, wherein the insulation layer is made by curing the aforesaid resin composition at high temperature and high pressure to the C-stage, a suitable curing temperature being for example between 150° C. and 220° C. and preferably between 190° C. and 210° C. and a suitable curing time being 90 to 180 minutes and preferably 120 to 150 minutes. The insulation layer may be obtained by curing the aforesaid prepreg or resin film. The metal foil may comprise copper, aluminum, nickel, platinum, silver, gold or alloy thereof, such as a copper foil.

Preferably, the laminate is a copper-clad laminate (CCL).

The laminate may be further processed by trace formation processes to provide a circuit board (i.e., printed circuit board).

Specifically, the resin composition disclosed herein or articles made therefrom have one, more or all of the following properties:
1. a dissipation factor as measured by reference to JIS C2565 at 10 GHz of less than or equal to 0.00171 (e.g., between 0.00158 and 0.00171) after being subject to moisture absorption for 168 hours at a temperature of 85° C. and a relative humidity of 85%;
2. an increase rate of dissipation factor after moisture absorption of less than or equal to 3% (e.g., between 0.61% and 2.42%);
3. a comparative tracking index as measured by reference to ASTM D3638 of greater than or equal to 210V (e.g., between 211V and 315V);
4. an X-axis thermal expansion coefficient as measured by reference to IPC-TM-650 2.4.24.5 of less than or equal to 17.0 ppm/° C. (e.g., between 15.1 ppm/° C. and 16.8 ppm/° C.); and
5. a temperature coefficient of dielectric constant as measured by reference to IPC-TM-650 2.5.5.13 of less than or equal to 100 ppm/° C. (e.g., between 37 ppm/° C. and 98 ppm/° C.).

Materials and reagents used in Preparation Examples, Examples and Comparative Examples disclosed herein are listed below:

SA-9000: methacrylate-terminated polyphenylene ether resin, available from Sabic.
OPE-2st 2200: vinylbenzyl-terminated polyphenylene ether resin, available from Mitsubishi Gas Chemical Co., Inc.
TAIC: triallyl isocyanurate, commercially available.
BVPE: 1,2-bis(vinylphenyl)ethane, available from Linchuan Chemical Co., Ltd.
BMI-70: 3,3-dimethyl-5,5'-diethyl-4,4'-diphenylmethane bismaleimide resin, available from K.I Chemical Industry Co., Ltd.
HLBH-P2000: hydroxyl-terminated hydrogenated polybutadiene, as shown below, available from Cray Valley.

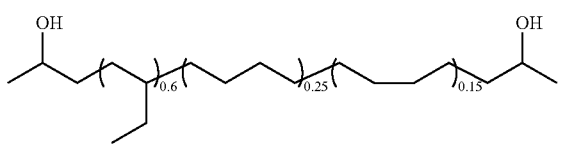

Resin of Formula (1): modified hydroxyl-terminated hydrogenated polybutadiene (not containing terminal hydroxyl group after modification), available from Cray Valley, as shown by Formula (1).
Ricon 100: butadiene-styrene copolymer, available from Cray Valley.
B-1000: polybutadiene, available from Nippon Soda Co., Ltd.
H1052: hydrogenated styrene-butadiene copolymer, available from Asahi Kasei Corp.
G-1701: styrene-ethylene-propylene copolymer, available from KRATON.
$2MgO(SiO_2)$: magnesium oxide-silica, having a particle size distribution ($D_{50}$) of about 2-5 μm, available from Nissan Chemical Corporation.
525: fused silica, available from SIBELCO.
SC-2050 SVJ: spherical silica, available from Admatechs.
G2-C: composite inorganic filler, available from SIBELCO.
$Al_2O_3$: aluminum oxide, available from DENKA.
AlOOH: boehmite, available from Nabaltec.
$Mg_3Ca(CO_3)_4$: huntite, available from Alfa Chemistry.
TALC: talc powder, available from Aladdin.
25B: peroxide, available from NOF Corporation.
Toluene and methyl ethyl ketone are commercially available.

Samples (specimens) were prepared as described below and tested and analyzed under specified conditions below.

Prepreg

Resin compositions from different Examples (E1 to E12) and Comparative Examples (C1 to C13) listed in Table 1 to Table 4 were respectively added to a stirred tank, well mixed and fully dissolved as varnishes and then loaded to an impregnation tank. A fiberglass fabric (e.g., 7628 E-glass fiber fabric, 2116 L-glass fiber fabric or 1067 L-glass fiber fabric) was immersed into the impregnation tank to adhere the resin composition on the fiberglass fabric, followed by heating at 120° C. to 150° C. to the semi-cured state (B-Stage) to obtain the prepreg, wherein the prepreg made from 7628 E-glass fiber fabric has a resin content of about 42%, the prepreg made from 2116 L-glass fiber fabric has a resin content of about 55%, and the prepreg made from 1067 L-glass fiber fabric has a resin content of about 70%.

Copper-Clad Laminate (Obtained by Laminating Two Prepregs)

Two 18 μm hyper very low profile (HVLP) copper foils and two prepregs (resin content of about 55% or about 70%, made by using 2116 L-glass fiber fabric or 1067 L-glass fiber fabric respectively) made from each resin composition were prepared. A copper foil, two prepregs and a copper foil were superimposed in such order and then subject to a vacuum condition for lamination at 200° C. for 2 hours to form each copper-clad laminate. Insulation layers were formed by curing (C-stage) two sheets of superimposed prepreg between the two copper foils, and the resin content of the insulation layers was about 55% (using 2116 L-glass fiber fabric) or about 70% (using 1067 L-glass fiber fabric).

Copper-Clad Laminate (Obtained by Laminating Eighteen Prepregs)

Two 18 μm hyper very low profile (HVLP) copper foils and eighteen prepregs (resin content of about 42%, made by using 7628 E-glass fiber fabric) made from each resin composition were prepared. A copper foil, eighteen prepregs and a copper foil were superimposed in such order and then subject to a vacuum condition for lamination at 200° C. for 2 hours to form each copper-clad laminate. Insulation layers were formed by curing (C-stage) eighteen sheets of superimposed prepreg between the two copper foils, and the resin content of the insulation layers was about 42% (using 7628 E-glass fiber fabric).

Copper-Free Laminate (Obtained by Laminating Two Prepregs)

Each copper-clad laminate obtained by laminating two prepregs was etched to remove the two copper foils to obtain a copper-free laminate made from laminating two prepregs and having a resin content of about 55% or about 70%.

Copper-Free Laminate (Obtained by Laminating Eighteen Prepregs)

Each copper-clad laminate obtained by laminating eighteen prepregs was etched to remove the two copper foils to obtain a copper-free laminate made from laminating eighteen prepregs and having a resin content of about 42%.

Test items and test methods are described below.

1. Dissipation factor $Df_1$ (T (temperature)=25° C., RH (relative humidity)=65%) The aforesaid copper-free laminate (obtained by laminating two prepregs made from 1067 L-glass fiber fabric) was subject to dissipation factor measurement. Each specimen was measured by using a microwave dielectrometer (available from AET Corp.) at 10 GHz frequency by reference to JIS C2565 at room temperature of 25° C. and 65% relative humidity. Lower dissipation factor represents better dielectric properties of the specimen. Under a 10 GHz frequency, for a dissipation factor value of less than or equal to 0.0040, a difference in $Df_1$ of less than 0.00005 represents no substantial difference in dissipation factor in different laminates, and a difference in $Df_1$ of greater than or equal to 0.00005 represents a substantial difference (i.e., significant technical difficulty) in dissipation factor in different laminates.

2. Dissipation factor $Df_2$ (T=85° C., RH=85%)

The aforesaid copper-free laminate (obtained by laminating two prepregs made from 1067 L-glass fiber fabric) was subject to dissipation factor measurement. Each specimen was measured by using a microwave dielectrometer (available from AET Corp.) at 10 GHz frequency by reference to JIS C2565 after moisture absorption for 168 hours at 85° C. and 85% relative humidity. Lower dissipation factor represents better dielectric properties of the sample. Under a 10 GHz frequency, for a dissipation factor value of less than or equal to 0.0040, a difference in $Df_2$ of less than 0.00005 represents no substantial difference in dissipation factor in different laminates, and a difference in $Df_2$ of greater than or equal to 0.00005 represents a substantial difference (i.e., significant technical difficulty) in dissipation factor in different laminates.

3. Increase rate of dissipation factor (after moisture absorption)

The dissipation factor $Df_1$ and the dissipation factor $Df_2$ are applied to an equation to calculate the increase rate of dissipation factor after moisture absorption of the specimen (increase rate of dissipation factor (after moisture absorption))=(($Df_2$−$Df_1$)/$Df_1$)*100%).

4. Comparative tracking index (CTI)

The aforesaid copper-free laminate sample (obtained by laminating eighteen prepregs) with a size of 100 mm*100 mm*3 mm was measured by reference to ASTM D3638, during which a 100V voltage was applied to the sample on the tester, followed by addition of one drop of 0.1 wt % ammonium chloride aqueous solution every 30 seconds until tracking was formed, and the total number of drops added was recorded. If tracking was not formed after the addition of 50 drops, the voltage was increased from 1V to 101V to test the tolerable voltage value of the sample ranging from 100V to 400V. The unit used in the comparative tracking index test is voltage (abbreviated as "V"). A difference in voltage of greater than or equal to 5V represents a substantial difference.

5. X-axis thermal expansion coefficient (a.k.a. coefficient of thermal expansion, CTE)

The aforesaid copper-free laminate (obtained by laminating two prepregs made from 2116 L-glass fiber fabric) was subject to thermal expansion coefficient (X-axis) measurement. In a temperature range from 50° C. to 260° C., a thermal mechanical analyzer (TMA) was used for the measurement of thermal expansion coefficient (alpha 1 in X-axis, 50° C. to 150° C. temperature range, unit: ppm/° C.) of each sample by reference to IPC-TM-650 2.4.24.5. Lower thermal expansion coefficient represents lower expansion of the sample under heat, indicating the resin composition may have a better property when being used for a printed circuit board. Lower thermal expansion coefficient is more preferred; in general, a difference of greater than or equal to 0.5 ppm/° C. in the thermal expansion coefficient represents a significant difference.

6. Temperature coefficient of dielectric constant

The aforesaid copper-free laminate sample (obtained by laminating two prepregs made from 1067 L-glass fiber fabric) with a size of 120 mm*85 mm*0.127 mm was subject to temperature coefficient of dielectric constant measurement. The change in dielectric constant of the sample in a temperature range of 25° C. to 50° C. was measured by using a SPDR split post dielectric resonant cavity (available from Waveray) by reference to IPC-TM-650 2.5.5.13 at 10 GHz and 65% relative humidity. Lower change in the temperature coefficient of dielectric constant during temperature increase represents more stable dielectric constant of the insulation layers of the copper-free laminate, such that a printed circuit board made from the copper-free laminate may achieve more stable signal transmission at high temperature. A difference in temperature coefficient of dielectric constant of greater than or equal to 10 ppm/° C. represents substantial difference.

Compositions and test results of resin compositions of Examples and Comparative Examples are listed below (in part by weight):

TABLE 1

Resin compositions of Examples (in part by weight) and test results

| Component | Name | E1 | E2 | E3 | E4 | E5 | E6 | E7 |
| --- | --- | --- | --- | --- | --- | --- | --- | --- |
| vinyl-containing polyphenylene ether resin | SA-9000 | 30 | 30 | 30 | 30 | 30 | 30 | 30 |
| | OPE-2st 2200 | 40 | 40 | 40 | 40 | 40 | 40 | 40 |
| crosslinking agent | TAIC | 20 | 20 | 20 | 20 | 20 | 20 | 20 |
| | BVPE | 10 | 10 | 10 | 10 | 10 | 10 | 10 |
| | BMI-70 | | | | | | | |
| resin of Formula (1) | resin of Formula (1) | 14 | 20 | 10 | 15 | 16 | 10 | 20 |

TABLE 1-continued

Resin compositions of Examples (in part by weight) and test results

| | | | | | | | | |
|---|---|---|---|---|---|---|---|---|
| polyolefin | HLBH-P2000 | | | | | | | |
| | Ricon 100 | | | | | | | |
| | B-3000 | | | | | | | |
| | H1052 | | | | | | | |
| | G-1701 | | | | | | | |
| inorganic filler | magnesium oxide-silica 525 | | | | | 30 | 30 | 30 |
| | SC-2050 SVJ | 30 | 30 | 30 | 25 | | | |
| | G2-C | | | | 10 | | | |
| | Al$_2$O$_3$ | | | | | | | |
| | AlOOH | | | | | | | |
| | Mg$_3$Ca(CO$_3$)$_4$ | | | | | | | |
| | TALC | | | | | | | |
| curing initiator | 25B | 0.3 | 0.3 | 0.3 | 0.3 | 0.3 | 0.3 | 0.3 |
| solvent | toluene | 70 | 70 | 70 | 70 | 70 | 70 | 70 |
| | MEK | 30 | 30 | 30 | 30 | 30 | 30 | 30 |

| Property | Unit | E1 | E2 | E3 | E4 | E5 | E6 | E7 |
|---|---|---|---|---|---|---|---|---|
| dissipation factor Df$_1$ | none | 0.00168 | 0.00166 | 0.00168 | 0.00169 | 0.00160 | 0.00158 | 0.00156 |
| dissipation factor Df$_2$ | none | 0.00170 | 0.00168 | 0.00171 | 0.00171 | 0.00162 | 0.00160 | 0.00158 |
| Df increase rate (after moisture absorption) | % | 1.19 | 1.20 | 1.79 | 1.18 | 1.25 | 1.27 | 1.28 |
| comparative tracking index | voltage | 223 | 225 | 219 | 211 | 303 | 300 | 305 |
| X-axis thermal expansion coefficient | ppm/° C. | 16.8 | 16.6 | 16.4 | 16.5 | 15.9 | 15.5 | 15.7 |
| temperature coefficient of dielectric constant | ppm/° C. | 83 | 82 | 93 | 98 | 37 | 38 | 37 |

TABLE 2

Resin compositions of Examples (in part by weight) and test results

| Component | Name | E8 | E9 | E10 | E11 | E12 |
|---|---|---|---|---|---|---|
| vinyl-containing polyphenylene ether resin | SA-9000 | 30 | 50 | 50 | 35 | 30 |
| | OPE-2st 2200 | 40 | 20 | 20 | 35 | 40 |
| crosslinking agent | TAIC | 20 | 20 | 20 | 5 | 20 |
| | BVPE | 10 | 5 | 5 | 15 | 10 |
| | BMI-70 | | 5 | 4 | 2 | |
| resin of Formula (1) | resin of Formula (1) | 15 | 15 | 15 | 15 | 20 |
| polyolefin | HLBH-P2000 | | | | | |
| | Ricon 100 | | 5 | 5 | | 2 |
| | B-3000 | | | | 5 | |
| | H1052 | | | | | |
| | G-1701 | | | | | 1 |
| inorganic filler | magnesium oxide-silica 525 | 40 | 25 | 20 | 45 | 35 |
| | SC-2050 SVJ | | | | 5 | |
| | G2-C | | | 10 | 35 | 5 |
| | Al$_2$O$_3$ | | | | | |
| | AlOOH | | | | | |
| | Mg$_3$Ca(CO3)$_4$ | | | | | |
| | TALC | | | | | |
| curing initiator | 25B | 0.3 | 0.3 | 0.3 | 0.3 | 0.3 |
| solvent | toluene | 70 | 70 | 70 | 70 | 70 |
| | MEK | 30 | 30 | 30 | 30 | 30 |

| Property | Unit | E8 | E9 | E10 | E11 | E12 |
|---|---|---|---|---|---|---|
| dissipation factor Df$_1$ | none | 0.00165 | 0.00167 | 0.00168 | 0.00169 | 0.00165 |
| dissipation factor Df$_2$ | none | 0.00169 | 0.00169 | 0.00170 | 0.00171 | 0.00166 |
| Df increase rate (after moisture absorption) | % | 2.42 | 1.20 | 1.19 | 1.18 | 0.61 |
| comparative tracking index | voltage | 313 | 309 | 310 | 315 | 311 |
| X-axis thermal expansion coefficient | ppm/° C. | 15.2 | 15.3 | 15.1 | 15.7 | 16.2 |
| temperature coefficient of dielectric constant | ppm/° C. | 27 | 47 | 48 | 43 | 38 |

TABLE 3

Resin compositions of Comparative Examples (in part by weight) and test results

| Component | Name | C1 | C2 | C3 | C4 | C5 | C6 | C7 | C8 |
|---|---|---|---|---|---|---|---|---|---|
| vinyl-containing polyphenylene ether resin | SA-9000 | 30 | 30 | 30 | 30 | 30 | 30 | 30 | 30 |
|  | OPE-2st 2200 | 40 | 40 | 40 | 40 | 40 | 40 | 40 | 40 |
| crosslinking agent | TAIC | 20 | 20 | 20 | 20 | 20 | 20 | 20 | 20 |
|  | BVPE | 10 | 10 | 10 | 10 | 10 | 10 | 10 | 10 |
|  | BMI-70 |  |  |  |  |  |  |  |  |
| resin of Formula (1) | resin of Formula (1) |  | 15 |  |  |  |  |  |  |
| polyolefin | HLBH-P2000 |  |  | 20 |  |  |  |  |  |
|  | Ricon 100 |  |  |  | 20 | 10 |  |  | 5 |
|  | B-3000 |  |  |  |  | 10 |  |  | 5 |
|  | H1052 |  |  |  |  |  | 20 |  | 5 |
|  | G-1701 |  |  |  |  |  |  | 20 | 5 |
| inorganic filler | magnesium oxide-silica 525 |  |  |  | 30 | 30 | 30 | 30 |  |
|  | SC-2050 SVJ | 30 |  | 30 |  |  |  |  | 30 |
|  | G2-C |  |  |  |  |  |  |  |  |
|  | $Al_2O_3$ |  |  |  |  |  |  |  |  |
|  | AlOOH |  |  |  |  |  |  |  |  |
|  | $Mg_3Ca(CO_3)_4$ |  |  |  |  |  |  |  |  |
|  | TALC |  |  |  |  |  |  |  |  |
| curing initiator | 25B | 0.3 | 0.3 | 0.3 | 0.3 | 0.3 | 0.3 | 0.3 | 0.3 |
| solvent | toluene | 70 | 70 | 70 | 70 | 70 | 70 | 70 | 70 |
|  | MEK | 30 | 30 | 30 | 30 | 30 | 30 | 30 | 30 |

| Property | Unit | C1 | C2 | C3 | C4 | C5 | C6 | C7 | C8 |
|---|---|---|---|---|---|---|---|---|---|
| dissipation factor $Df_1$ | none | 0.00218 | 0.00173 | 0.00304 | 0.00201 | 0.00200 | 0.00205 | 0.00205 | 0.00206 |
| dissipation factor $Df_2$ | none | 0.00237 | 0.00179 | 0.00380 | 0.00208 | 0.00208 | 0.00212 | 0.00215 | 0.00217 |
| Df increase rate (after moisture absorption) | % | 8.72 | 3.47 | 25.00 | 3.48 | 4.00 | 3.41 | 4.88 | 5.34 |
| comparative tracking index | voltage | 205 | 163 | 232 | 221 | 231 | 216 | 218 | 227 |
| X-axis thermal expansion coefficient | ppm/°C. | 16.0 | 19.5 | 18.1 | 17.8 | 18.5 | 19.5 | 18.5 | 17.5 |
| temperature coefficient of dielectric constant | ppm/°C. | 153 | 45 | 184 | 74 | 61 | 56 | 53 | 105 |

TABLE 4

Resin compositions of Comparative Examples (in part by weight) and test results

| Component | Name | C9 | C10 | C11 | C12 | C13 |
|---|---|---|---|---|---|---|
| vinyl-containing polyphenylene ether resin | SA-9000 | 30 | 30 | 30 | 30 | 30 |
|  | OPE-2st 2200 | 40 | 40 | 40 | 40 | 40 |
| crosslinking agent | TAIC | 20 | 20 | 20 | 20 | 20 |
|  | BVPE | 10 | 10 | 10 | 10 | 10 |
|  | BMI-70 |  |  |  |  |  |
| resin of Formula (1) | resin of Formula (1) |  |  | 14 |  | 14 |
| polyolefin | HLBH-P2000 |  |  |  |  |  |
|  | Ricon 100 |  |  |  |  |  |
|  | B-3000 |  |  |  |  |  |
|  | H1052 |  |  |  |  |  |
|  | G-1701 |  |  |  |  |  |
| inorganic filler | magnesium oxide-silica 525 |  |  |  |  |  |
|  | SC-2050 SVJ |  |  |  |  |  |
|  | G2-C | 30 |  |  |  |  |
|  | $Al_2O_3$ |  | 30 |  |  |  |
|  | AlOOH |  |  | 30 |  |  |
|  | $Mg_3Ca(CO_3)_4$ |  |  |  | 30 |  |
|  | TALC |  |  |  |  | 30 |
| curing initiator | 25B | 0.3 | 0.3 | 0.3 | 0.3 | 0.3 |
| solvent | toluene | 70 | 70 | 70 | 70 | 70 |
|  | MEK | 30 | 30 | 30 | 30 | 30 |

| Property | Unit | C9 | C10 | C11 | C12 | C13 |
|---|---|---|---|---|---|---|
| dissipation factor $Df_1$ | none | 0.00451 | 0.00262 | 0.00523 | 0.00425 | 0.00427 |
| dissipation factor $Df_2$ | none | 0.00481 | 0.00275 | 0.00658 | 0.00491 | 0.00452 |

TABLE 4-continued

Resin compositions of Comparative Examples (in part by weight) and test results

| | | | | | | |
|---|---|---|---|---|---|---|
| Df increase rate (after moisture absorption) | % | 6.65 | 4.96 | 25.81 | 15.53 | 5.85 |
| comparative tracking index | voltage | 220 | 289 | 275 | 211 | 267 |
| X-axis thermal expansion coefficient | ppm/° C. | 17.5 | 17.6 | 17.7 | 17.5 | 18.1 |
| temperature coefficient of dielectric constant | ppm/° C. | 676 | 416 | 781 | 252 | 898 |

The following observations can be made according to the test results above.

Example E1 (using the resin of Formula (1)), in contrast to Comparative Example C1 (not using the resin of Formula (1)), achieves the effects of $Df_1$ (T=25° C., RH=65%) of less than or equal to 0.00169, $Df_2$ (T=85° C., RH=85%, after 168 hours of moisture absorption) of less than or equal to 0.00171, Df increase rate (after moisture absorption) of less than or equal to 3.0%, comparative tracking index of greater than or equal to 210V and temperature coefficient of dielectric constant of less than or equal to 100 ppm/° C. In contrast, Comparative Example C1 fails to achieve the above-mentioned effects.

Examples E4 and E8 (using magnesium oxide-silica, silica or a combination thereof), in contrast to Comparative Example C2 (not using magnesium oxide-silica, silica or a combination thereof), achieve the effects of $Df_1$ (T=25° C., RH=65%) of less than or equal to 0.00169, $Df_2$ (T=85° C., RH=85%, after 168 hours of moisture absorption) of less than or equal to 0.00171, Df increase rate (after moisture absorption) of less than or equal to 3.0%, comparative tracking index of greater than or equal to 210V and X-axis thermal expansion coefficient of less than or equal to 17 ppm/° C. In contrast, Comparative Example C2 fails to achieve the above-mentioned effects.

Example E2 (using the resin of Formula (1)), in contrast to Comparative Example C3 (using a different rubber resin), achieves the effects of $Df_1$ (T=25° C., RH=65%) of less than or equal to 0.00169, $Df_2$ (T=85° C., RH=85%, after 168 hours of moisture absorption) of less than or equal to 0.00171, Df increase rate (after moisture absorption) of less than or equal to 3.0%, X-axis thermal expansion coefficient of less than or equal to 17 ppm/° C. and temperature coefficient of dielectric constant of less than or equal to 100 ppm/° C. In contrast, Comparative Example C3 fails to achieve the above-mentioned effects.

Example E7 (using the resin of Formula (1)), in contrast to Comparative Examples C4 to C7 (using a different rubber resin), achieves the effects of $Df_1$ (T=25° C., RH=65%) of less than or equal to 0.00169, $Df_2$ (T=85° C., RH=85%, after 168 hours of moisture absorption) of less than or equal to 0.00171, Df increase rate (after moisture absorption) of less than or equal to 3.0% and X-axis thermal expansion coefficient of less than or equal to 17 ppm/° C. In contrast, Comparative Examples C4 to C7 fail to achieve the above-mentioned effects.

Example E2 (using the resin of Formula (1)), in contrast to Comparative Example C8 (not using the resin of Formula (1)), achieves the effects of $Df_1$ (T=25° C., RH=65%) of less than or equal to 0.00169, $Df_2$ (T=85° C., RH=85%, after 168 hours of moisture absorption) of less than or equal to 0.00171, Df increase rate (after moisture absorption) of less than or equal to 3.0%, X-axis thermal expansion coefficient of less than or equal to 17 ppm/° C. and temperature coefficient of dielectric constant of less than or equal to 100 ppm/° C. In contrast, Comparative Example C8 fails to achieve the above-mentioned effects.

Examples E1 to E8 and E12 (using the resin of Formula (1) and using magnesium oxide-silica, silica or a combination thereof), in contrast to Comparative Example C9 (not using the resin of Formula (1) and using a different inorganic filler), achieve the effects of $Df_1$ (T=25° C., RH=65%) of less than or equal to 0.00169, $Df_2$ (T=85° C., RH=85%, after 168 hours of moisture absorption) of less than or equal to 0.00171, Df increase rate (after moisture absorption) of less than or equal to 3.0%, X-axis thermal expansion coefficient of less than or equal to 17 ppm/° C. and temperature coefficient of dielectric constant of less than or equal to 100 ppm/° C. In contrast, Comparative Example C9 fails to achieve the above-mentioned effects.

Example E1 (using magnesium oxide-silica, silica or a combination thereof), in contrast to Comparative Example C10 (using a different inorganic filler), achieves the effects of $Df_1$ (T=25° C., RH=65%) of less than or equal to 0.00169, $Df_2$ (T=85° C., RH=85%, after 168 hours of moisture absorption) of less than or equal to 0.00171, Df increase rate (after moisture absorption) of less than or equal to 3.0%, X-axis thermal expansion coefficient of less than or equal to 17 ppm/° C. and temperature coefficient of dielectric constant of less than or equal to 100 ppm/° C. In contrast, Comparative Example C10 fails to achieve the above-mentioned effects.

Examples E1 to E8 and E12 (using the resin of Formula (1) and using magnesium oxide-silica, silica or a combination thereof), in contrast to Comparative Examples C11 and C12 (not using the resin of Formula (1) and not using magnesium oxide-silica, silica or a combination thereof), achieve the effects of $Df_1$ (T=25° C., RH=65%) of less than or equal to 0.00169, $Df_2$ (T=85° C., RH=85%, after 168 hours of moisture absorption) of less than or equal to 0.00171, Df increase rate (after moisture absorption) of less than or equal to 3.0%, X-axis thermal expansion coefficient of less than or equal to 17 ppm/° C. and temperature coefficient of dielectric constant of less than or equal to 100 ppm/° C. In contrast, Comparative Examples C11 and C12 fail to achieve the above-mentioned effects.

Comparison of Example E1 (using magnesium oxide-silica, silica or a combination thereof) with Comparative Example C13 (using a different inorganic filler) shows that Examples E1 to E8 and E12 achieve the effects of $Df_1$ (T=25° C., RH=65%) of less than or equal to 0.00169, $Df_2$ (T=85° C., RH=85%, after 168 hours of moisture absorption) of less than or equal to 0.00171, Df increase rate (after moisture absorption) of less than or equal to 3.0%, X-axis thermal expansion coefficient of less than or equal to 17 ppm/° C. and temperature coefficient of dielectric constant of less than or equal to 100 ppm/° C. In contrast, Comparative Example C13 fails to achieve the above-mentioned effects.

The above detailed description is merely illustrative in nature and is not intended to limit the embodiments of the subject matter or the application and uses of such embodiments. As used herein, the term "exemplary" means "serving as an example, instance, or illustration." Any implementation described herein as exemplary is not necessarily to be construed as preferred or advantageous over other implementations.

Moreover, while at least one exemplary example or comparative example has been presented in the foregoing detailed description, it should be appreciated that a vast number of variations exist. It should also be appreciated that the exemplary one or more embodiments described herein are not intended to limit the scope, applicability, or configuration of the claimed subject matter in any way. Rather, the foregoing detailed description will provide those skilled in the art with a convenient guide for implementing the described one or more embodiments. Also, various changes can be made in the function and arrangement of elements without departing from the scope defined by the claims, which include known equivalents and foreseeable equivalents at the time of filing this patent application.

What is claimed is:

1. A resin composition, comprising:
   (A) a vinyl-containing polyphenylene ether resin;
   (B) a resin of Formula (1):

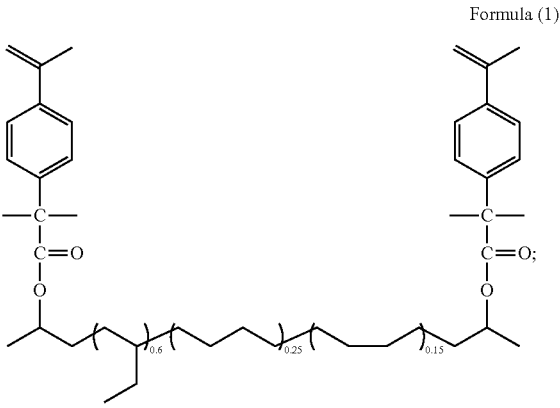

Formula (1)

and
   (C) an inorganic filler.

2. The resin composition of claim 1, comprising 70 parts by weight of (A) the vinyl-containing polyphenylene ether resin and 10 to 20 parts by weight of (B) the resin of Formula (1).

3. The resin composition of claim 1, wherein (C) the inorganic filler comprises magnesium oxide-silica, silica or a combination thereof.

4. The resin composition of claim 3, wherein the magnesium oxide-silica has a particle size distribution ($D_{50}$) of 2 µm≤$D_{50}$≤5 µm.

5. The resin composition of claim 3, which comprises 20 to 50 parts by weight of the magnesium oxide-silica and 5 to 50 parts by weight of the silica.

6. The resin composition of claim 1, further comprising maleimide resin, (meth)acrylate, triallyl isocyanurate, triallyl cyanurate, styrene maleic anhydride, 1,2-bis(vinylphenyl)ethane, bis(vinylbenzyl)ether, 1,2,4-trivinyl cyclohexane, divinylbenzene, styrene, polyolefin, epoxy resin, cyanate ester resin, maleimide triazine resin, phenolic resin, benzoxazine resin, polyester resin, amine curing agent, polyamide resin, polyimide resin or a combination thereof.

7. The resin composition of claim 1, further comprising flame retardant, curing accelerator, polymerization inhibitor, surface treating agent, coloring agent, toughening agent, solvent or a combination thereof.

8. An article made from the resin composition of claim 1, which comprises a prepreg, a resin film, a laminate or a printed circuit board.

9. The article of claim 8, having a dissipation factor as measured by reference to JIS C2565 of less than or equal to 0.00171 after being subject to moisture absorption for 168 hours at a temperature of 85° C. and a relative humidity of 85%.

10. The article of claim 8, having an increase rate of dissipation factor after moisture absorption of less than or equal to 3%.

11. The article of claim 8, having a comparative tracking index as measured by reference to ASTM D3638 of greater than or equal to 210 V.

12. The article of claim 8, having an X-axis thermal expansion coefficient as measured by reference to IPC-TM-650 2.4.24.5 of less than or equal to 17.0 ppm/° C.

13. The article of claim 8, having a temperature coefficient of dielectric constant as measured by reference to IPC-TM-650 2.5.5.13 of less than or equal to 100 ppm/° C.

* * * * *